United States Patent [19]
Arroyo et al.

[11] Patent Number: 5,502,732
[45] Date of Patent: Mar. 26, 1996

[54] METHOD FOR TESTING ECC LOGIC

[75] Inventors: Ronald X. Arroyo; William E. Burky; Tricia A. Gruwell, all of Austin; Joaquin Hinojosa, Round Rock, all of Tex.

[73] Assignee: International Business Machines Corporation, Armonk, N.Y.

[21] Appl. No.: 123,829

[22] Filed: Sep. 20, 1993

[51] Int. Cl.⁶ .................................................. H03M 13/00
[52] U.S. Cl. ................................. 371/30; 371/3; 371/22.1
[58] Field of Search ............................ 371/3, 10.1, 21.1, 371/16.5, 20.4, 21.2, 21.6, 23, 37.3, 37.7, 40.2, 30

[56] References Cited

U.S. PATENT DOCUMENTS

| | | |
|---|---|---|
| 4,319,356 | 3/1982 | Kocol et al. |
| 4,359,771 | 11/1982 | Johnson et al. ............... 371/3 |
| 4,561,095 | 12/1985 | Khan ............................... 371/3 |
| 4,759,019 | 7/1988 | Bentley et al. ................. 371/3 |
| 4,852,100 | 7/1989 | Christensen et al. |
| 4,878,220 | 10/1989 | Hashimoto ...................... 371/3 |
| 4,899,341 | 2/1990 | Tomimitsu |
| 4,899,342 | 2/1990 | Potter et al. |
| 4,961,193 | 10/1990 | Debord et al. |
| 4,980,888 | 12/1990 | Bruce et al. |
| 5,024,357 | 6/1991 | Anderson |
| 5,056,089 | 10/1991 | Furuta et al. .................. 371/3 |
| 5,157,669 | 10/1992 | Yu et al. |
| 5,222,069 | 6/1993 | Chevalley |
| 5,224,106 | 6/1993 | Weng |
| 5,291,496 | 3/1994 | Andaleon et al. ............. 371/3 |
| 5,293,383 | 3/1994 | Knefel ........................... 371/3 |

*Primary Examiner*—Emanuel T. Voeltz
*Assistant Examiner*—Thomas Peeso
*Attorney, Agent, or Firm*—Thomas E. Tyson; Andrew J. Dillon

[57] ABSTRACT

A system and method for checking the test logic contained in a computer memory system during POST such that any errors can be determined and made available to the system software prior to beginning processing operations. Single and double bit errors are induced which the ECC logic must identify and correct. The CPU compares the data that is written to memory with the data that is read back. Thus, since it is known that an error occurred, due to the induced error provided by the present invention, identical data will verify that the ECC correction logic is working properly. More specifically, a multiplexer is provided in the data write path which substitutes a constant set of identical bits for the actual data generated by the CPU. ECC bits are generated based on the actual generated test data, rather than the inserted identical bits. The substituted data bits and generated ECC bits are then stored in memory. An error condition is identified when the data and ECC code is read back from memory. The correction logic then corrects the data, in the case of a single bit error, such that the data read by the CPU is the same as the originally generated data.

16 Claims, 6 Drawing Sheets

METHOD FOR TESTING ECC LOGIC

BACKGROUND OF THE INVENTION

1. Field of the Invention

The present invention relates to a system and method for testing the error checking and correction (ECC) logic in a computer system. More specifically, the test mechanism alters the data and ECC check bits during power on self test (POST) and compares the altered bits with actual values to induce error conditions.

2. Description of Related Art

Conventionally, ECC logic is provided that generates an ECC code, also called check bits, which corresponds to a particular data value and is stored along with the data value in system memory from a central processing unit (CPU). When the data is read back from memory, the ECC check bits are again calculated and compared with the originally generated ECC bits in order to test the system memory. The difference in these ECC check bits is the syndrome which, if nonzero, indicates that an error has occurred. During normal operations, this code will be encountered during every read and write operation to memory, thus the validity of the ECC logic is very important. In the event that an error condition for a single bit data error is detected, the ECC correction logic is utilized to correct the invalid data bit.

U.S. Pat. No. 4,852,100 describes a system which performs error detection and correction. This system generates ECC codes, including mutually independent sub-codes corresponding to distinct blocks of data being stored in a memory system. Errors are detected and corrected in data as it is read from the memory. U.S. Pat. No. 4,319,356 is a self correcting memory system including a control circuit with a refresh address counter that supplies an address to memory to refresh a block of data words. An error detection and correction circuit is also provided that periodically checks and corrects bit errors in the data words. The correction circuit includes a self-correct address counter that checks and corrects data words during each refresh cycle. U.S. Pat. No. 5,157,669 is an apparatus for use with a data storage device which stores data in sectors including three blocks. First and second syndromes are generated according to data in the data sector's second and third blocks. An estimated syndrome is then provided according to the second syndrome. The apparatus then compares the estimated error code with the first generated error code in order to detect uncorrectable errors. U.S. Pat. No. 4,961,193 describes digital error detection and correction apparatus wherein an error correcting code gives a first syndrome from an error coming from a first package and a second syndrome from a single error in a second package. The error correcting code is such that equality of the first and second syndromes results in the equality of the first and second errors. U.S. Pat. No. 4,980,888 uses a self test controller to sequence and evaluate errors. Error correction code is used to generate redundancy symbols such that the symbols corresponding to inverted data are the binary inverse of redundancy symbols corresponding to non-inverted data. Each bit location of an addressable storage location can be tested in three read/write cycles, i.e. each location can be tested for storage and retrieval of both a binary one and a binary zero.

It can be seen that conventional systems are used which perform testing of the system memory using ECC code, and its relationship to data values written to the memory. However, none of these systems perform testing on the ECC logic itself. It can readily be seen that if the ECC logic is faulty, then testing the memory system may provide erroneous results such that the processing system can incorrectly determine that the memory is good or bad. Therefore, it can be seen that a need exists for an efficient method and apparatus for testing the actual ECC logic itself, which is subsequently used to test system memory.

SUMMARY OF THE INVENTION

In contrast to the prior art, the present invention allows the test logic contained in a computer system to be tested during POST such that any errors can be determined and made available to the system software prior to beginning processing operations.

Broadly, the present invention induces single and double bit errors which the ECC logic must identify and correct, if possible. The CPU compares the data that is written to memory with the data that is read back. For single bit errors, the data should be identical since the ECC logic will identify and correct errors. Thus, since it is known that an error occurred due to the induced error provided by the present invention, identical data will verify that the ECC correction logic is working properly. More specifically, a multiplexer is provided in the data write path which substitutes a constant set of identical bits for the actual data generated by the CPU. Concurrently, ECC check bits are generated based on the actual generated test data, rather than the inserted identical bits. The substituted data bits and generated ECC bits are then stored in memory. An error condition is identified when the data and ECC codes are read back from memory. The correction logic then corrects the data, in the case of a single bit error, such that the data read by the CPU is the same as the originally generated data. For the case of double bit errors, the ECC correction logic is not capable of correcting these errors, but their existence will be identified. Additionally, a multiplexer is provided in the ECC code read path which substitutes a constant set of identical bits for the ECC bits read from memory. Initially, the ECC check bits were generated based on the actual data from the CPU, such that a comparison by the ECC logic should identify an error condition when the initial ECC bits are compared with the substituted ECC bits. Again, if the ECC logic is working properly, the correct data will be passed back to the CPU for a single bit error in the ECC check bits. In each case, a status and address register will be set to indicate the existence of an error condition, in accordance with the substitution of erroneous data and ECC check bits.

Therefore, in accordance with the previous summary, other objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
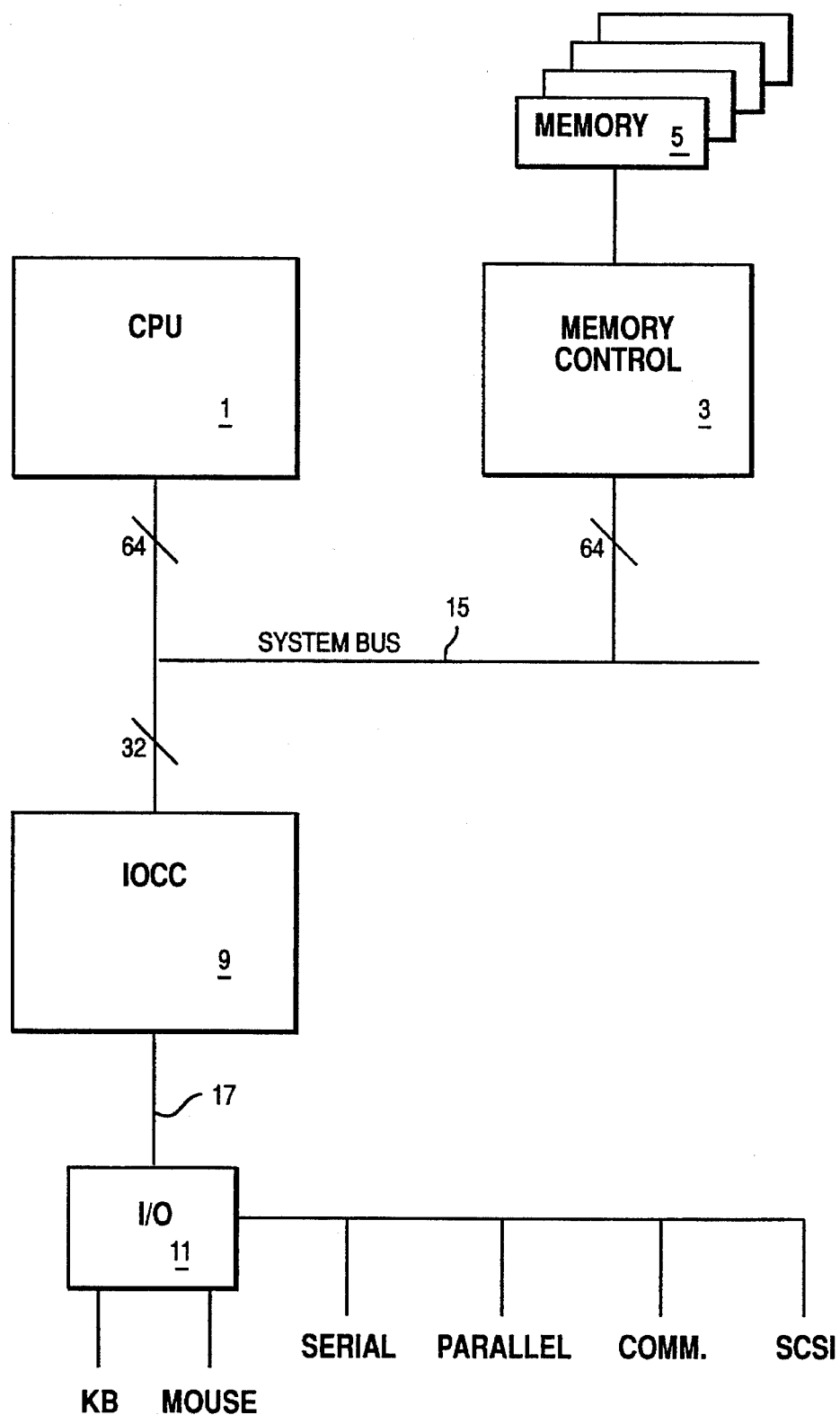
FIG. 1 is a block diagram showing a data processing system on which the present invention may be implemented.
Figure 2:
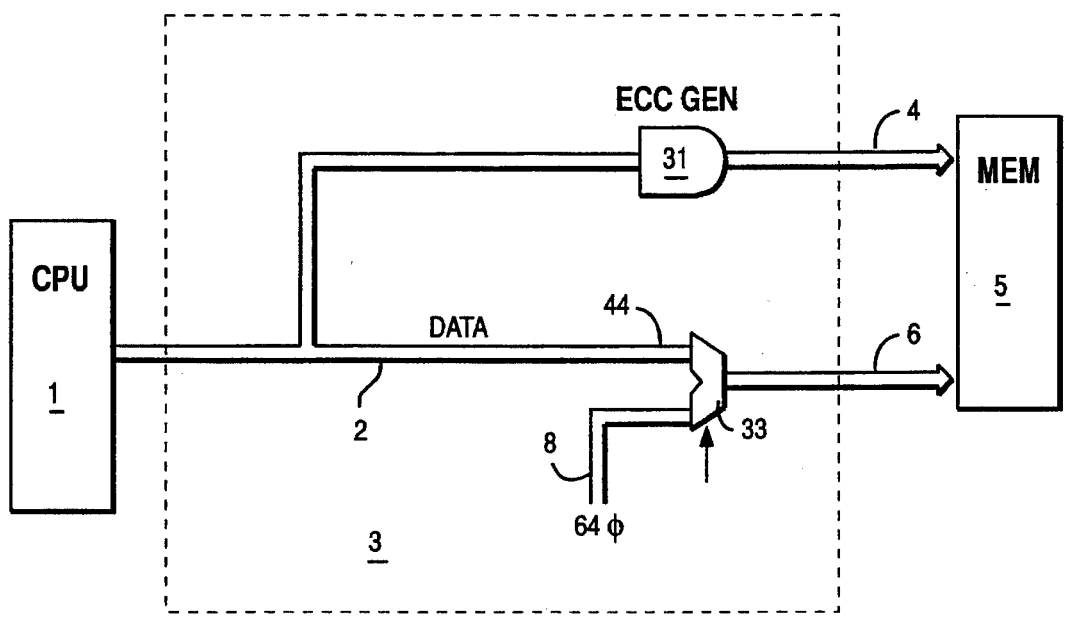
FIG. 2 is a logic diagram showing the ECC test components of the present invention utilized during a memory write operation.
Figure 3:
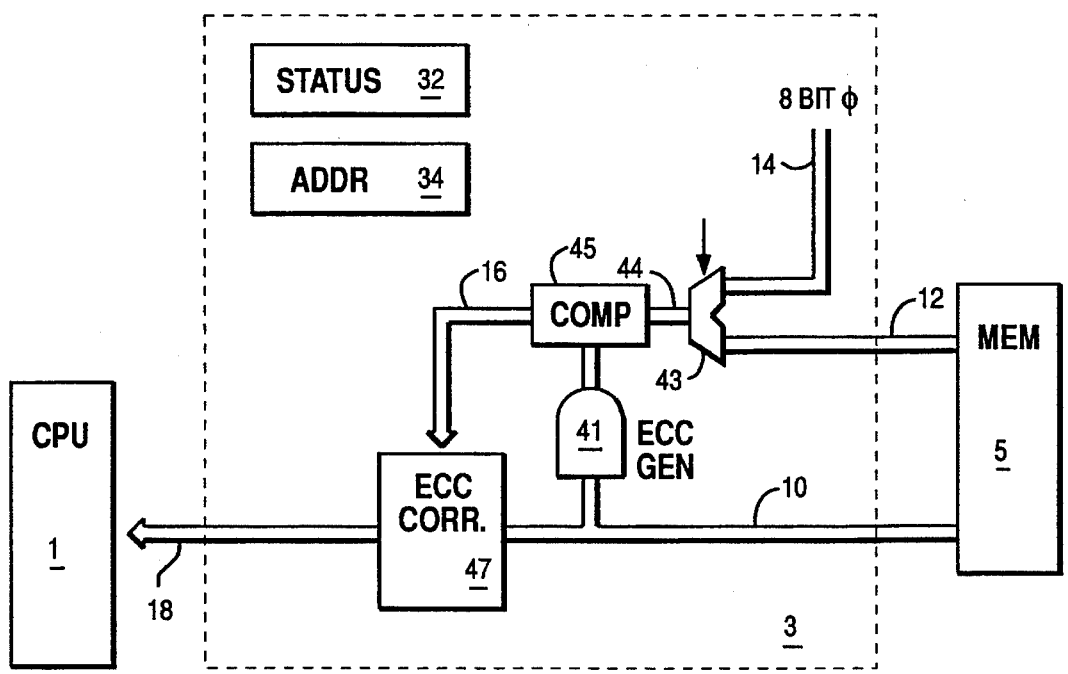
FIG. 3 is another logic diagram illustrating the components used during a read operation by the present invention used.

Referring to FIG. 1, a computer system on which the present invention can be implemented is shown wherein reference numeral 1 is a central processing unit (CPU), such as the PowerPC 601 Microprocessor (PowerPC is a trademark of IBM Corporation), that is connected to a system bus 15. Memory control chip 3 is also shown which controls the data transfers into and out of system memory 5. Input/output control chip 9 is shown interconnected with system bus 15 and also with I/O bus 17. I/O chip 11 consolidates inputs from the keyboard, mouse, serial and parallel ports, communications and small computer systems interface (SCSI) to present a single interconnection with I/O bus 17. The present invention allows testing of ECC logic as shown in FIGS. 2 and 3. The test logic of the present invention will be implemented in hardware on the memory control chip 3. System software running on the CPU will perform the testing during the boot process.

Referring to FIG. 2, CPU 1 is shown along with memory control chip 3 and memory storage 5. FIG. 2 represents a write operation, wherein CPU 1 may be one of any number of commercially available central processing units capable of generating error checking and correction code (ECC), such as the PowerPC 601 Microprocessor (PowerPC is a trademark of IBM Corporation) available from IBM. System software running on CPU 1 generates data used to ensure the validity of memory 5 by testing the memory sector therein. This testing occurs during power on self test (POST) and CPU 1 may generate data utilized to induce single bit and double bit errors. In a preferred embodiment of the present invention, data bus 2 is 64 bits wide. Error checking and correction code generator 31 utilizes the 64 bit test data, generated by CPU 1, in order to generate ECC check bits which are provided to memory 5 along bus 4. These ECC check bits are 8 bits wide and correspond to the data generated by CPU 1. In accordance with the write procedure of the present invention, 64 bit data is provided along bus 2 to multiplexer 33 and then on to 64 bit bus 6 for placement in memory 5. Thus, a total of 72 bits are stored for a data write operation, 8 bits being ECC and 64 bits for the data itself. Multiplexer 33 is capable of being enabled such that a series of identical bits (in a preferred embodiment all zeros), are forced through bus 8 and multiplexer 33 onto data bus 6, thereby substituting all zeros for the data generated by CPU 1, which enters multiplexer 33 via bus 2. Therefore, it can be seen how the hardware logic of FIG. 2 allows 64 zeros to be stored in memory 5 in lieu of the test data generated by CPU 1. It should be noted that the present invention contemplates substituting 64 logical ones for the test data generated by CPU 1. It can be seen that ECC generation logic 31 will generate the ECC check bits corresponding to the actual data generated by CPU 1 and placed on bus 2.

FIG. 3, shows the hardware logic utilized by the present invention when the stored data is read back from memory 5. Again, CPU 1, memory controller 3, and memory storage 5 are shown. Bus 10 allows CPU 1 to read back the 64 bit data previously written to memory 5 along bus 6 of FIG. 2. Bus 12 allows the 8 bit ECC code previously written to memory 5 along bus 4 to be read back. ECC generator 41 provides the ECC code based upon the data read back from memory 5 along bus 10. This generated ECC code is then provided to comparator 45. The ECC code read from memory 5 along bus 12 is provided to a multiplexer 43 along with a sequence of identical logical values, e.g. logical zeros, provided to multiplexer 43 along bus 14. Multiplexer 43 can be enabled such that the 8 bits of logical zeros are forced through multiplexer 43 and along bus 44 to comparator 45. The comparison is then made between the ECC code read back from memory 5, on bus 12 or 14, with ECC code generated by generator 41 in accordance with data read from memory 5 on bus 10. Any difference in the check bits from ECC generator 41 and those read back along bus 12 from memory 5 or from bus 14 is called the syndrome, which if nonzero determines that an ECC error has occurred. This syndrome is then provided along bus 16 to the ECC correction logic 47 which is capable of correcting single bit errors, i.e. changing the state of a logical one to a logical zero, or a logical zero to a logical one. The corrected data is then provided along bus 18 back to CPU 1 which compares the corrected data with the data previously written to bus 2. Additionally, the status register 32 and address register 34 are provided in memory controller 3. Status register 32 is written with the type of error which occurred, i.e. a double bit or single bit error and the syndrome, and address register 34 includes the address of the data word that had the ECC error. If no error has occurred, the values of both the status register and the address register will be zero. Therefore, the data written by CPU 1 on bus 2 should be identical to the data read from memory 5 off of bus 18, unless a double bit error has occurred. CPU 1 then reads status register 32 and address register 34 which should indicate that an error has occurred, and if so, it is then determined that the ECC correction logic is in fact working because the error which was induced during the write operation has been corrected.

The present invention is realized by intercepting data to be written to memory 5, and ECC check bits read back from memory 5. The memory controller receives the test data generated by the CPU 1 from CPU data bus 2. The present invention then allows ECC check bits to be generated corresponding to this data. Using a data pattern with one or two bits set, single and double bit error generation is accomplished by substituting all logical zeros for the write data before it is driven off the chip and on to memory 5. Previously generated ECC check bits remain unaltered. Therefore, since the ECC check bits that are written to memory are based on the original generated data, the associated read will result in a single or double bit error depending on the original write data pattern generated by CPU 1. The number of bits set in the data pattern generated by the CPU determines the size of the error, i.e. one bit for a single bit error and two bits for a double bit error. In this manner, the generated test data is checked for errors.

A similar technique is used to check single or double bit errors in the ECC check bits, except that logical zeros are substituted for the ECC check bits during a CPU read operation. In this case, the data from the CPU remains unaltered. As noted above, the memory status and memory address registers are used to log errors their location in memory. System software is capable of reading these registers to gain information about an ECC error once it occurs. Status register 32 contains two pieces of data, one is the type of error that occurred (single bit, double bit or none) and the other is the syndrome. The memory error address register 34 contains the address of the double word which included the ECC error.

The single bit error detection and correction portion of the ECC logic can be completely tested by setting a diagnostic bit for the memory controller to a logical one. There are two diagnostic bits. The first one controls multiplexer 33, and the second one controls multiplexer 43. CPU 1 then walks a logical one through the 64 bit data pattern (1, 2, 4, 8, 16, . . . ), which is stored to memory for all 64 data bits. However, in each case the actual data value which is stored to memory is zero. This comes from bus 8 through multiplexer 33 onto bus 6 of FIG. 2. After each individual write operation (or subsequent to writing all data patterns to memory), data is read back from memory. In this case, ECC generation logic 41 will generate ECC check bits based on the 64 logical zeros read back from memory 5 along bus 10. The actual ECC code generated during the write operation by generator 31 and stored to memory 5 on bus 4 is allowed to be forced into comparator 45 from bus 15 by multiplexer 43. Comparator 45 then determines the syndrome from the actual ECC check bits generated by logic 31 and the check bits generated by logic 41, based on the logical zeros. This syndrome is then provided along bus 16 to correction logic 47, which corrects the error and provides the valid data back to CPU 1 along bus 18. The state of the status registers 32 and 34 are then read and should reflect a single bit ECC error and the corresponding syndrome value. The error address is then read which indicates the location of memory where the single bit error occurred.

For example, if the data generated by CPU 1 has only data bit 63 set, and is written to memory address X'00000020', it would be stored as a zero due to multiplexer 33 forcing the logical zeros onto bus 6. When read back from memory, a single bit error should be detected and corrected for bit 63. The memory status of the register 32 should reflect a single bit error, and the syndrome should reflect an error in bit 63. Also, the address register 34 should hold X'00000020', which is the location at which the error occurred.

In order to test the ECC check bits, 8 unique data patterns are used that produce check bits with only one bit set. System software stores these data patterns in a table and the second diagnostic bit is used to clear the ECC check bits during a load operation. For example, assume a data pattern "A" is written by CPU 1 to address X'00000040' in memory 5. This data pattern "A" produces check bits equal to B'00000001'. When address X'00000040' is read back, data pattern "A" is expected. Since the ECC check bits were cleared on the read operation by multiplexer 43 forcing 8 logical zero bits on bus 44 to comparator 45 from bus 14, the syndrome determined by comparator 45 will be nonzero. In this case, the status register will indicate a single bit error, and the syndrome should identify memory data bit 71 (the 8th check bit) as the bit in error. The memory address register should contain address X'00000040.' These registers will be read and verified by system software. A write and corresponding read operation for each of the 8 ECC data bit patterns will allow single bit error detection for all of the generated ECC check bits.

For double bit error detection, the diagnostic bit controlling multiplexer 33 is enabled and CPU 1 writes a data pattern with two bits set. The ECC check bits will be calculated and stored correctly but the actual data values will be logical zeros inserted by multiplexer 33 of FIG. 2. When the address is read back, the ECC check bits will not match because ECC generator 31 placed check bits corresponding to the actual data generated by the CPU 1 into memory 5 and ECC generator 41 will generate check bits based on logical zeros read back from memory 5 along bus 10. Thus, the syndrome will be nonzero and indicate that a double bit error has occurred. Status register 32 will indicate a double bit error and the memory address register 34 will indicate the corresponding address where the error occurred. It should be noted that ECC correction logic 47 is incapable of correcting double bit errors. Therefore, the present invention will only detect double bit errors.

Figure 4A:
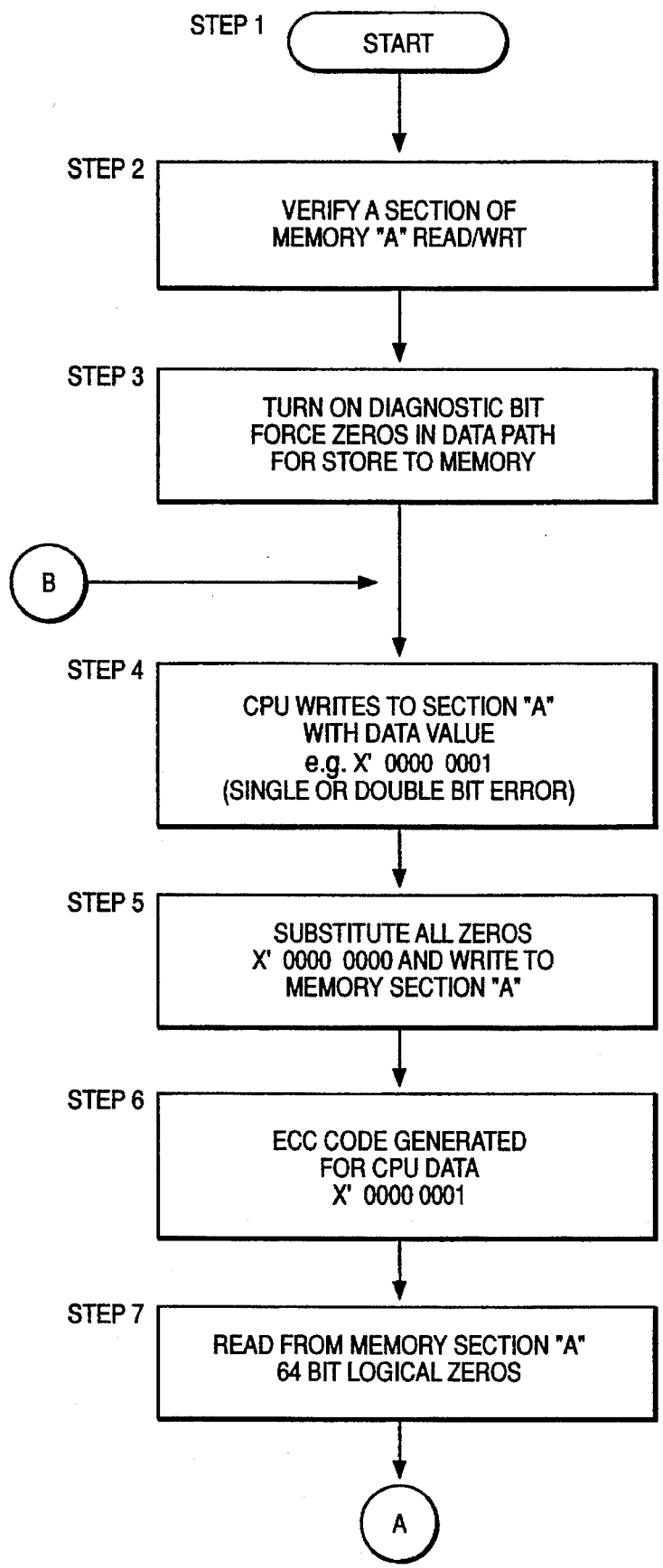
FIGS. 4a and 4b are flow charts delineating the sequence of events used to check memory sections when known incorrect bits are substituted for the data stored to memory.
Figure 4B:
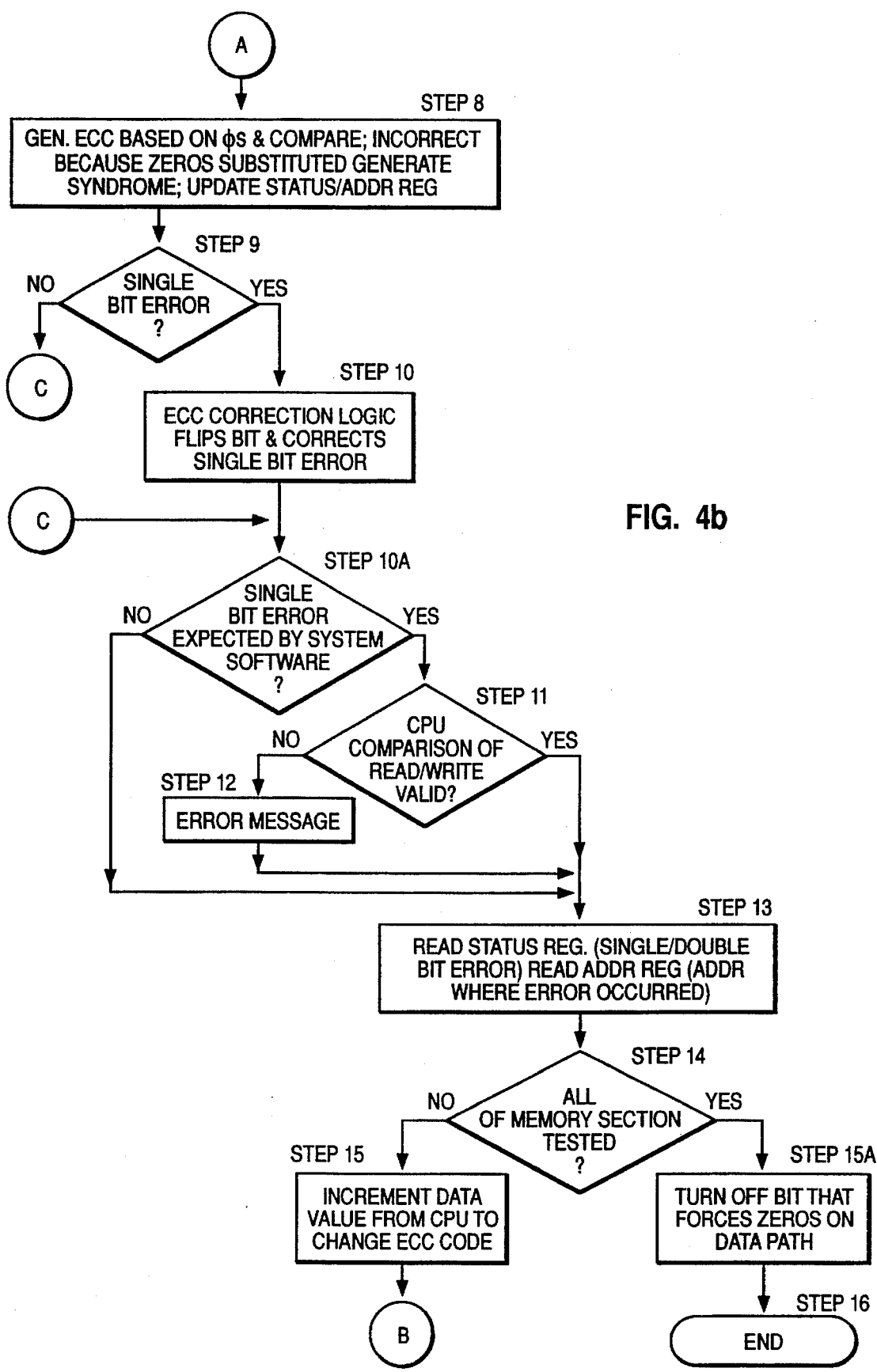

FIGS. 4a and 4b are a flowchart representing the process implemented by the present invention to check the ECC logic for errors relating to the 64 bit data generated by CPU 1, and stored in memory 5. At step 1 the process is started and at step 2, CPU 1 verifies a section of memory in memory system 5 by utilizing a standard read and write back process. Once the section of memory is verified, step 3 then turns on a diagnostic bit to allow multiplexer 33 to substitute 64 bits of logical zeros onto bus 6 (FIG. 2). At step 4, CPU 1 then writes test data to the verified section of memory 5 along bus 2. For example, X'00000000 00000001' may be an initial data value wherein subsequent data will walk a logical one through the 64 bits. This is to verify that a single bit error can be detected and corrected for all 64 of the data bits. At step 5, the 64 logical zeros from bus 8 are substituted onto bus 6 instead of the data generated in step 4. The substituted logical zeros are then written to the verified section of memory along with the ECC check bits generated from the CPU data provided at step 4. At step 7, the data is read back from memory. In this case, 64 logical zeros are read from memory 5 via bus 10 of FIG. 3 (step 7). ECC logic 41 then generates an 8 bit ECC code based on the 64 logical zeros read back from memory 5 on bus 10. This ECC code is then compared with the ECC code read back from memory on bus 15, which is generated by logic 31 based on the CPU data (step 8). This comparison is implemented by comparator 45 and generates the syndrome (step 8). Based on this syndrome, it is then determined by the memory controller at step 9 if a single bit error has occurred. If so, the process continues to step 10 wherein ECC correction logic 47 flips the single bit, which is invalid, to the other state (logical zero to logical one, or logical one to logical zero) in order to correct the single bit error. However, if the error is determined not to be a single bit error, the process skips step 10 and continues to step 10A wherein the system software determines if a single bit error had been expected. Subsequent to step 10A, the CPU compares, at step 11, the data written onto bus 2 with the data read from bus 18 to determine its validity. If the ECC correction logic is functioning properly, the data written to bus 2 and read from bus 18 should be identical, that is comparator 45 has generated a syndrome which correctly identified the induced error. However, if at step 11 it is determined that data from bus 18 does not match with the data written to bus 2 the ECC correction logic did not function properly and an error message is presented at step 12. If it is determined at step 9 that other than a single bit error is present, step 10 is skipped by the memory controller. If system software expects a single bit error, step 11 is done next, otherwise, steps 11 and 12 are bypassed. For single bit errors, the verified memory section is determined to be valid when the CPU matches the data written onto bus 2 with the data received from bus 18, and reads the status and address registers to determine that a single bit error has occurred. In the event of a double bit error, the CPU merely reads the status and address registers to determine that a double bit error was correctly identified by the ECC logic. At step 14 it is then determined if each data address in the verified memory section has been tested. Different data addresses are used in the present invention so that all of the ECC logic in memory control chip 3 is tested. If the test is not complete, the process continues to step 15 wherein the CPU increments the data value by walking a bit through each position, thereby changing the ECC code generated by logic 31. The process then returns to step 5. Once all of the memory section is tested, the multiplexer 33 is disabled at step 15a such that the 64 bits of logical zeros from bus 8 will not be forced onto bus 6 and the actual data generated by CPU 1 will be written to memory 5 from bus 6. The present invention then proceeds to step 16 and ends.

Figure 5A:
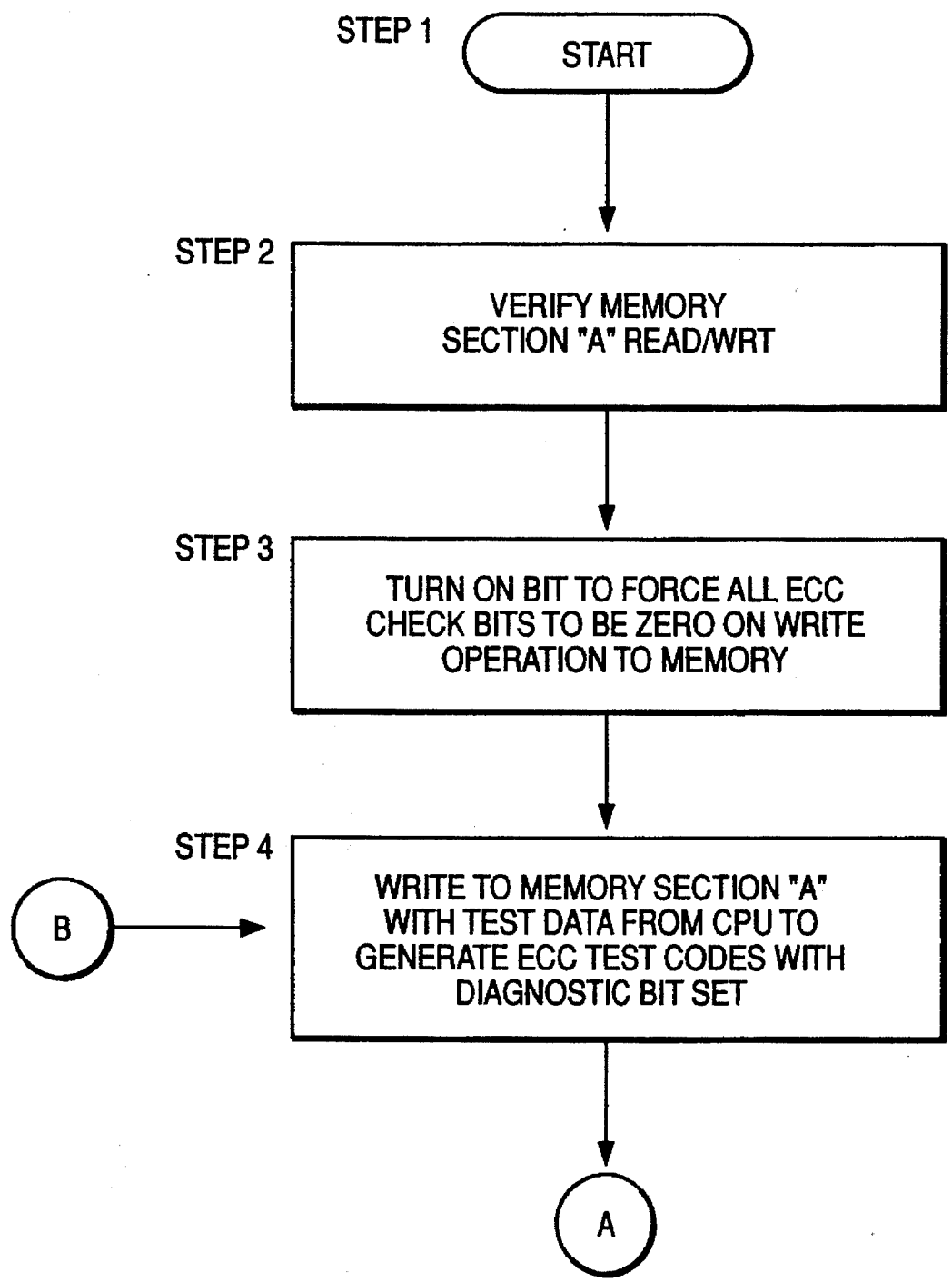
FIGS. 5a and 5b are flow charts showing the method used to check memory when known incorrect values are substituted for the ECC bits read from memory.
Figure 5B:
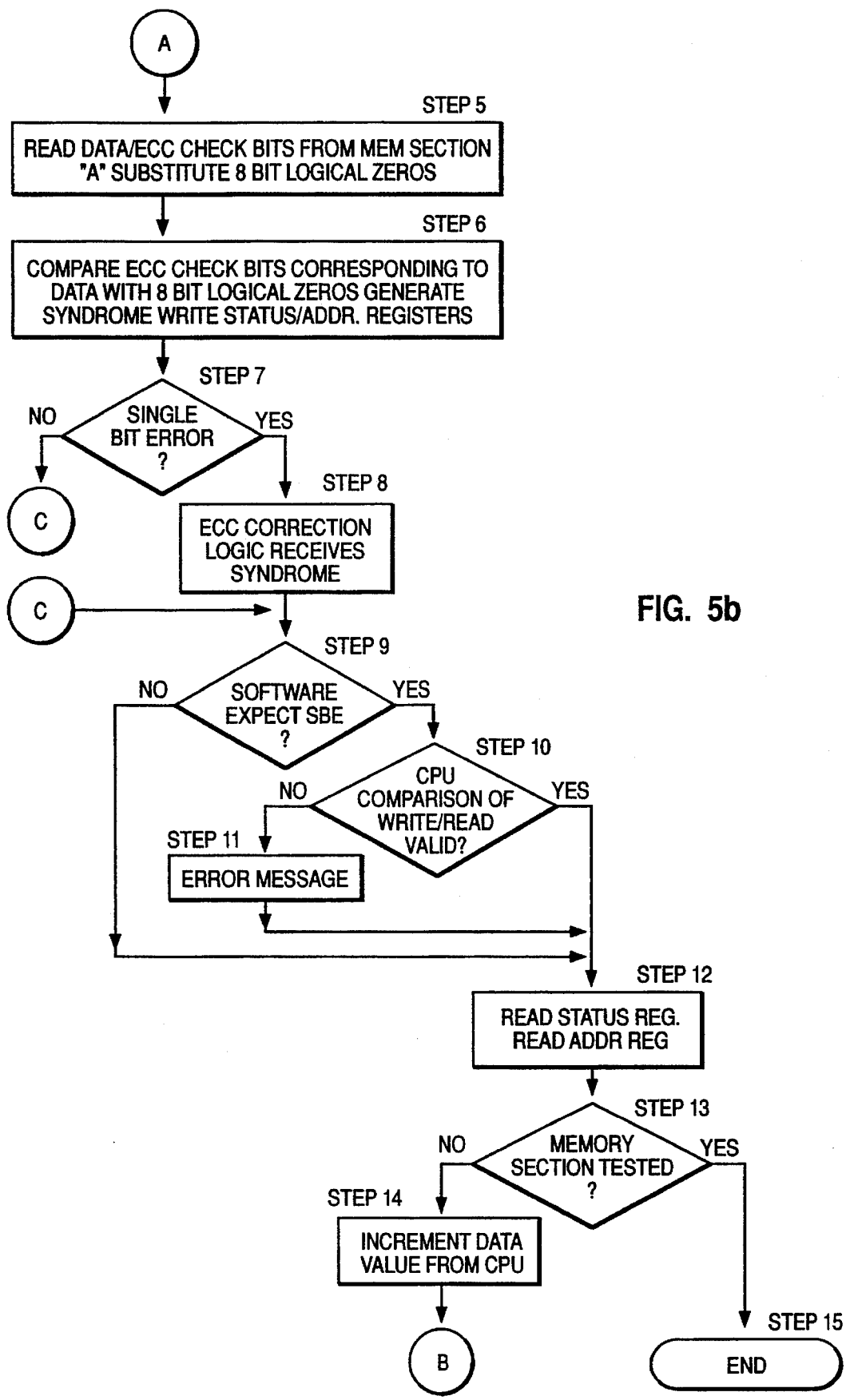

The flowchart of FIGS. 5a and 5b show the process utilized by the present invention to test error detection in the 8 bit ECC check code generated by the ECC logic of the present invention. At step 1 the process is started and step 2 verifies a memory section to be utilized for the test using a conventional write/read from CPU 1. The previous test stored zeros to memory along with check bits based on non zero data in memory. This previously stored data is cleared by rewriting to those memory addresses. Multiplexer 43 is then enabled at step 3 such that 8 bits of logical zeros will be forced from bus 14 and on bus 15 to comparator 45. The data generated by CPU 1 is then written to the verified section of memory 5. At this time, ECC logic 31 will generate ECC check bits corresponding to the data from CPU 1 which is placed on bus 2 and subsequently written to memory 5. These ECC check bits corresponding to the generated data are then written to memory 5 from bus 4. Thus, at step 4, the actual test data from CPU 1 is written to memory 5 along with corresponding ECC check bits generated by logic 31. The 64 bit data and 8 bit ECC check bits are then read from the verified section of memory 5 at step 5. At this time, the 8 bit logical zeros are forced through enabled multiplexer 43 and to comparator 45. Additionally, logic 41 generates ECC check bits based on the actual data which is being read from memory 5 on bus 10. Therefore, the ECC check bits actually corresponding to data on bus 10 and the 8 bit logical zero check bits are both provided to comparator 45 which then performs a comparison and generates a syndrome, at step 6. Additionally, at step 6, the status and address registers are written with the type of error, syndrome and location of the error. It can be seen that an error will in fact occur because the check bits generated by logic 41 are based upon actual data while 8 bits of logical zeros have been substituted for the check bits generated by logic 31 and input to comparator 45. At step 7 it is then determined if a single bit error has occurred and if so the process continues to step 8 where logic 47 receives the check bits. If other than a single bit error was detected at step 8, the process bypasses step 8 and step 9 determines whether the system software expected a single bit error. If a single bit error was not expected at step 9, CPU 1 reads the status and address registers and verifies the ECC logic has correctly identified the double bit error or the like (step 12). If a single bit error was expected, the CPU at step 10 compares the data written to memory 5 on bus 6 with data read back on 18, and if valid, i.e. the data should be identical, then reads the status and address registers at step 12 to verify that a single bit error was identified and corrected. If the CPU comparison at step 10 is invalid then an error message is displayed at step 11, thereby informing a system user of the existence of invalid ECC logic. Subsequent to step 12 it is determined at step 13 if the entire memory section has been tested, i.e. have ECC check bits have been generated for all of the test data from CPU 1. If the memory section test is incomplete then the CPU at step 14 increments the data to be placed on bus 2 by shifting the logical one to the next data bit. The process then returns to step 4 wherein the data generated by the CPU is written to memory 5 such that a corresponding ECC code is generated by logic 31. However, if it was determined at step 13 that the entire memory section had been tested then process continues to step 15 and ends.

Therefore, it can be seen that the present invention is a system and method for inducing single bit, double bit, and other errors and testing the error checking and correction logic to ensure that it is operational. In the case of single bit errors, if the CPU determines that the data written to memory is identical to the data read from memory and the status register and address registers show the existence of a single bit error, the syndrome and the address of the error, then the processing system is assured that the ECC logic is working properly. In the case of double bit errors, the present invention is able to identify the type of error, the syndrome and location in memory but is unable to correct the error such that the CPU comparison of data written to memory with data read from the memory will not be identical.

Although certain preferred embodiments have been shown and described it should be understood that many changes and modifications may be made therein without departing from the scope of the appended claims.

We claim:

1. A method of testing an error checking and correction (ECC) system in a data processing system having a memory, said method comprising the steps of:

supplying a first bit pattern to said ECC system, said first bit pattern including a plurality of bits each set to a logical state;

generating first check bits at said ECC system based upon said first bit pattern;

inducing an error by storing said first check bits within said memory in association with a second bit pattern, said second bit pattern including a plurality of bits wherein at least one bit among said plurality of bits within said second bit pattern is set to a different logical state than a corresponding bit within said first bit pattern;

generating second check bits at said ECC system based upon said second bit pattern; and comparing said first check bits with said second check bits to determine if said ECC system detected said error, wherein an error is detected when logical states of one or more corresponding bit positions within said first check bits and said second check bits differ.

2. A method according to claim 1 further comprising the step of reading said second bit pattern from said memory to generate said second check bits.

3. A method according to claim 2 wherein said step of comparing comprises calculating a syndrome based upon a difference between said first and second check bits, said method further comprising:

detecting from said syndrome whether a single bit error has occurred;

correcting said second bit pattern to match said first bit pattern in response to a detection of a single bit error; and logging the syndrome, error type, and an address within memory which stores said second bit pattern in at least one register.

4. A method according to claim 3 further comprising the steps of:

comparing the first bit pattern with said second bit pattern to verify that said second bit pattern has been corrected to match said first bit pattern; and reading said at least one register to verify that said error type has been correctly identified.

5. A system for testing an error checking and correction (ECC) system in a data processing system having a memory, said method comprising the steps of:

means for supplying a first bit pattern to said ECC system, said first bit pattern including a plurality of bits each set to a logical state;

means for generating first check bits at said ECC system based upon said first bit pattern;

means for inducing an error by storing said first check bits within said memory in association with a second bit pattern, said second bit pattern including a plurality of bits wherein at least one bit among said plurality of bits within said second bit pattern is set to a different logical state than a corresponding bit within said first bit pattern;

means for generating second check bits at said ECC system based upon said second bit pattern; and means for comparing said first check bits with said second check bits to determine if said ECC system detected said error, wherein an error is detected when logical states of one or more corresponding bit positions within said first check bits and said second check bits differ.

6. A system according to claim 5 further comprising means for reading said second bit pattern from said memory to generate said second check bits.

7. A system according to claim 6 wherein said means for comparing comprises means for calculating a syndrome based upon a difference between said first and second check bits, said system further comprising:

means for detecting from said syndrome whether a single bit error has occurred;

means for correcting said second bit pattern to match said first bit pattern in response to a detection of a single bit error; and means for logging the syndrome, an error type, and an address within memory which stores said second bit pattern in at least one register.

8. A system according to claim 7 further comprising:

means for comparing the first bit pattern with said second bit pattern to verify that said second bit pattern has been corrected to match said first bit pattern; and means for reading said at least one register to verify that said error type has been correctly identified.

9. A system according to claim 8, wherein each of said plurality of bits within said second bit pattern is set to an identical logical state.

10. A system according to claim 9, wherein said means for inducing an error comprises a multiplexer that replaces said first bit pattern with said second bit pattern when a diagnostic bit is turned on.

11. A method of testing an error checking and correction (ECC) system in a data processing system having a memory, said method comprising the steps of:

supplying a first bit pattern to said ECC system, said first bit pattern including a plurality of bits each set to a logical state;

generating first check bits at said ECC system based upon said first bit pattern;

writing said first check bits to said memory;

inducing an error by substituting second check bits for said first check bits when said first check bits are read from said memory; and comparing said first check bits with said second check bits to determine if said ECC system detected said error, wherein an error is detected when logical states of one or more corresponding bit positions within said first check bits and said second check bits differ.

12. A method according to claim 11 wherein said step of comparing comprises calculating a syndrome based upon a difference between said first and second check bits, said method further comprising:

detecting said induced error from said syndrome;

logging the syndrome, an error type, and an address within said memory which stores said first bit pattern in at least one register; and reading said at least one register to verify that said error type has been correctly identified.

13. A system for testing an error checking and correction (ECC) system in a data processing system having a memory, comprising:

means for supplying a first bit pattern to said ECC system, said first bit pattern including a plurality of bits each set to a logical state;

means for generating first check bits at said ECC system based upon said first bit pattern;

means for writing said first check bits to said memory;

means for inducing an error by substituting second check bits for said first check bits when said first check bits are read from said memory; and means for comparing said first check bits with said second check bits to determine if said ECC system detected said error, wherein an error is detected when logical states of one or more corresponding bit positions within said first check bits and said second check bits differ.

14. A system according to claim 13 wherein said means for comparing comprises means for calculating a syndrome based upon a difference between said first and second, said system further comprising:

means for detecting said induced error from said syndrome;

means for logging the syndrome, an error type, and an address within said memory which stores said first check bits in at least one register; and means for reading said at least one register to verify that said error type has been correctly identified.

15. A system according to claim 14, wherein each of said plurality of bits within said second check bits is set to an identical logical state.

16. A system according to claim 15 wherein said means for inducing an error comprises a multiplexer that replaces said first check bits with said second check bits when a diagnostic bit is turned on.

* * * * *